(12) United States Patent
Jensen et al.

(10) Patent No.: US 8,097,925 B2
(45) Date of Patent: Jan. 17, 2012

(54) INTEGRATED CIRCUIT GUARD RINGS

(75) Inventors: Bradley Jensen, San Jose, CA (US);
Charles Y. Chu, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/748,300

(22) Filed: Mar. 26, 2010

(65) Prior Publication Data

US 2011/0233717 A1    Sep. 29, 2011

(51) Int. Cl.
*H01L 29/66* (2006.01)
*H01L 29/02* (2006.01)

(52) U.S. Cl. ........................ 257/409; 257/487

(58) Field of Classification Search .................. None
See application file for complete search history.

(56) References Cited

U.S. PATENT DOCUMENTS

| | | | |
|---|---|---|---|
| 5,965,940 A | 10/1999 | Juengling | |
| 6,587,160 B2 * | 7/2003 | Kim et al. | 349/40 |
| 6,690,067 B2 * | 2/2004 | Ker et al. | 257/355 |
| 7,179,691 B1 * | 2/2007 | Lee et al. | 438/135 |
| 7,528,046 B2 * | 5/2009 | Ichige et al. | 438/296 |
| 2004/0052020 A1 * | 3/2004 | Ker et al. | 361/56 |
| 2009/0020326 A1 | 1/2009 | Takahashi et al. | |
| 2009/0020826 A1 * | 1/2009 | Huang et al. | 257/371 |
| 2009/0140370 A1 * | 6/2009 | Jou et al. | 257/487 |

FOREIGN PATENT DOCUMENTS

JP    2002-134506    5/2002
KR    10-2005-0106221    11/2005

OTHER PUBLICATIONS

Tan, Chee Hong. U.S. Appl. No. 12/717,796, filed Mar. 4, 2010.
Chen, Shuxian, et al. U.S. Appl. No. 12/623,161, filed Nov. 20, 2009.

* cited by examiner

*Primary Examiner* — Scott B Geyer
(74) *Attorney, Agent, or Firm* — Treyz Law Group; Jason Tsai; G. Victor Treyz

(57) ABSTRACT

Integrated circuits with guard rings are provided. Integrated circuits may include internal circuitry that is sensitive to external noise sources. A guard ring may surround the functional circuitry to isolate the circuitry from the noise sources. The guard ring may include first, second, and third regions. The first and third regions may include p-wells. The second region may include an n-well. Stripes of diffusion regions may be formed at the surface of a substrate in the three regions. Areas in the guard ring that are not occupied by the diffusion regions are occupied by shallow trench isolation (STI) structures. Stripes of dummy structures may be formed over respective STI structures and may not overlap the diffusion regions. The diffusion regions in the first and third regions may be biased to a ground voltage. The diffusion regions in the second section may be biased to a positive power supply voltage.

22 Claims, 10 Drawing Sheets

INTEGRATED CIRCUIT GUARD RINGS

BACKGROUND

This relates to integrated circuits, and more particularly, to integrated circuits with guard rings.

Integrated circuits include digital circuitry, analog circuitry, and/or other functional circuitry formed in a semiconductor substrate. Regions of circuitry are often surrounded by guard rings.

A guard ring is a structure that is used to block undesirable signals. In a typical scenario, an integrated circuit has internal circuitry that is coupled to external equipment through input-output pads. Noise can potentially leak from the external equipment through the pads onto the internal circuitry. A guard ring may be placed around the internal circuitry in this type of situation to isolate the internal circuitry from the noise. Guard rings can also be formed around noisy circuits to prevent noise from interfering with the operations of nearby circuits.

To ensure that noise is adequately suppressed, conventional guard rings generally have large widths. This can lead to fabrication challenges. For example, it can be difficult to satisfy polysilicon density requirements in integrated circuits with guard rings of large widths. The guard rings are generally devoid of polysilicon structures, which can lead to uneven surface profiles during chemical-mechanical polishing (CMP) operations.

It would therefore be desirable to be able to provide an improved guard ring that satisfies advanced fabrication requirements.

SUMMARY

Integrated circuits may have internal circuitry that communicates with external sources through input-output circuitry. The internal circuitry may include digital circuitry, analog circuitry, and other circuits. Noise signals from the external sources that pass through the input-output circuitry may negatively impact the performance of the internal circuitry. Internal circuits may also generate noise. Guard rings may be used to isolate noise sources and sensitive circuits from each other. For example, a guard ring may be formed around a sensitive circuit to isolate the sensitive circuit from noise or a guard ring may be placed around a noisy circuit to contain noise.

A guard ring may have a first well region, a second well region, and a third well region formed in a substrate (e.g., a silicon substrate). The first, second, and third sections may include a first p-well, an n-well, and a second p-well, respectively. The inside and the outside of the guard ring may be surrounded by field shallow trench isolation (STI) structures.

To enhance manufacturability, density compliance structures may be formed in the guard ring. The density compliance structures may, for example, be implemented using a stripe pattern or checkerboard pattern of dummy gate structures.

The dummy structures may include polysilicon structures that are formed over corresponding STI structures embedded within the well regions. The polysilicon structures may serve as dummy fill structures that help satisfy polysilicon density requirements. The dummy structures may serve as dummy support structures that prevent dishing and other undesirable polishing artifacts from arising in the guard ring during chemical-mechanical polishing (CMP) processing operations. The dummy structures may include hafnium or other conductive materials and may sometimes be referred to as dummy gates, because the dummy structures may be formed using the same types of structures that are used in forming transistor gates elsewhere on the integrated circuit.

During operation of the integrated circuit, the first and third regions of the guard ring may be driven to a ground voltage (e.g., zero volts). The second region of the guard ring may be supplied with a positive power supply voltage. A guard ring biased using this type of approach may behave like two reverse-biased diodes that share a common n-type junction. Two diodes arranged in this way can prevent passage of noise or other undesirable signals.

Further features of the present invention, its nature and various advantages will be more apparent from the accompanying drawings and the following detailed description.

DETAILED DESCRIPTION

This relates generally to integrated circuits, and more particularly, to integrated circuits with guard rings.

Integrated circuits include circuitry formed in a semiconductor substrate such as a silicon substrate. The circuitry may be sensitive to noise or leakage currents or may produce noise or leakage currents. Guard rings formed in the substrate may serve to isolate regions of circuitry for each other (e.g., by blocking noise, leakage currents, etc.)

Figure 1:
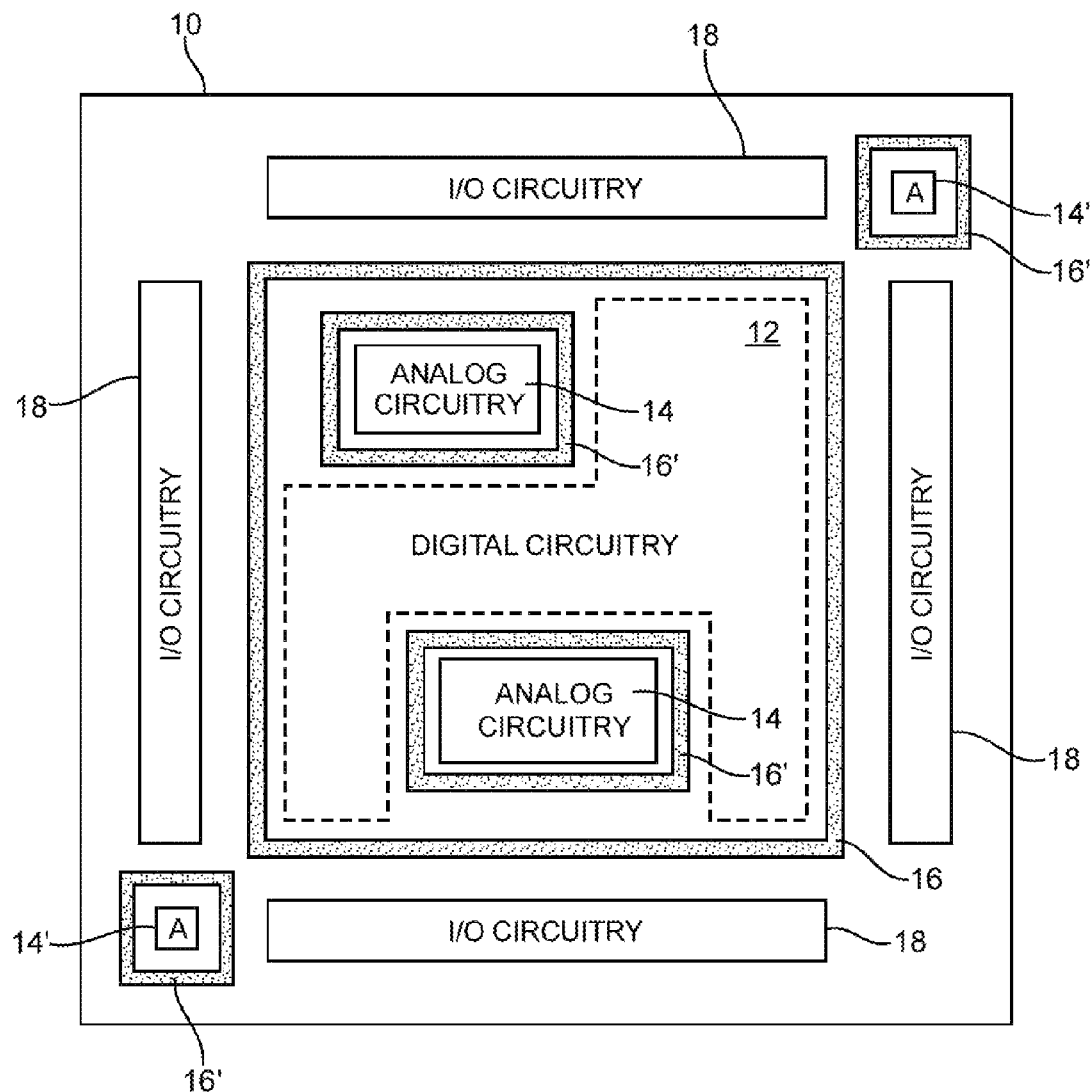
FIG. 1 is a diagram of an illustrative integrated circuit with guard rings in accordance with an embodiment of the present invention.

FIG. 1 shows an integrated circuit that includes digital circuitry 12, analog circuitry 14, and other circuitry formed in a substrate. Integrated circuit 10 may include input-output (I/O) circuitry such as I/O circuitry 18 formed on each side of integrated circuit 10. I/O circuitry 18 may include pads and other I/O circuits that allow integrated circuit 10 to communicate with external (off-chip) components.

Noise may leak from the external components onto integrated circuit 10 through I/O circuitry 18. A main guard ring such as guard ring 16 may surround the internal circuitry (e.g., digital circuitry 12, analog circuitry 14, etc.) to prevent this noise from affecting the operations of the internal circuitry.

Analog circuitry 14 may each have a dedicated guard ring such as guard ring 16'. Guard ring 16' may serve to isolate the analog circuitry from the digital circuitry so that interference is minimized. Peripheral analog circuitry such as analog circuitry 14' may be located at the corners of integrated circuit 10. Analog circuits 14' may each have a respective dedicated guard ring 16', if desired. In general, any circuitry that is sensitive to noise or other disturbances may be surrounded by a guard ring to guard the surrounded circuitry from undesired noise sources.

Figure 2:
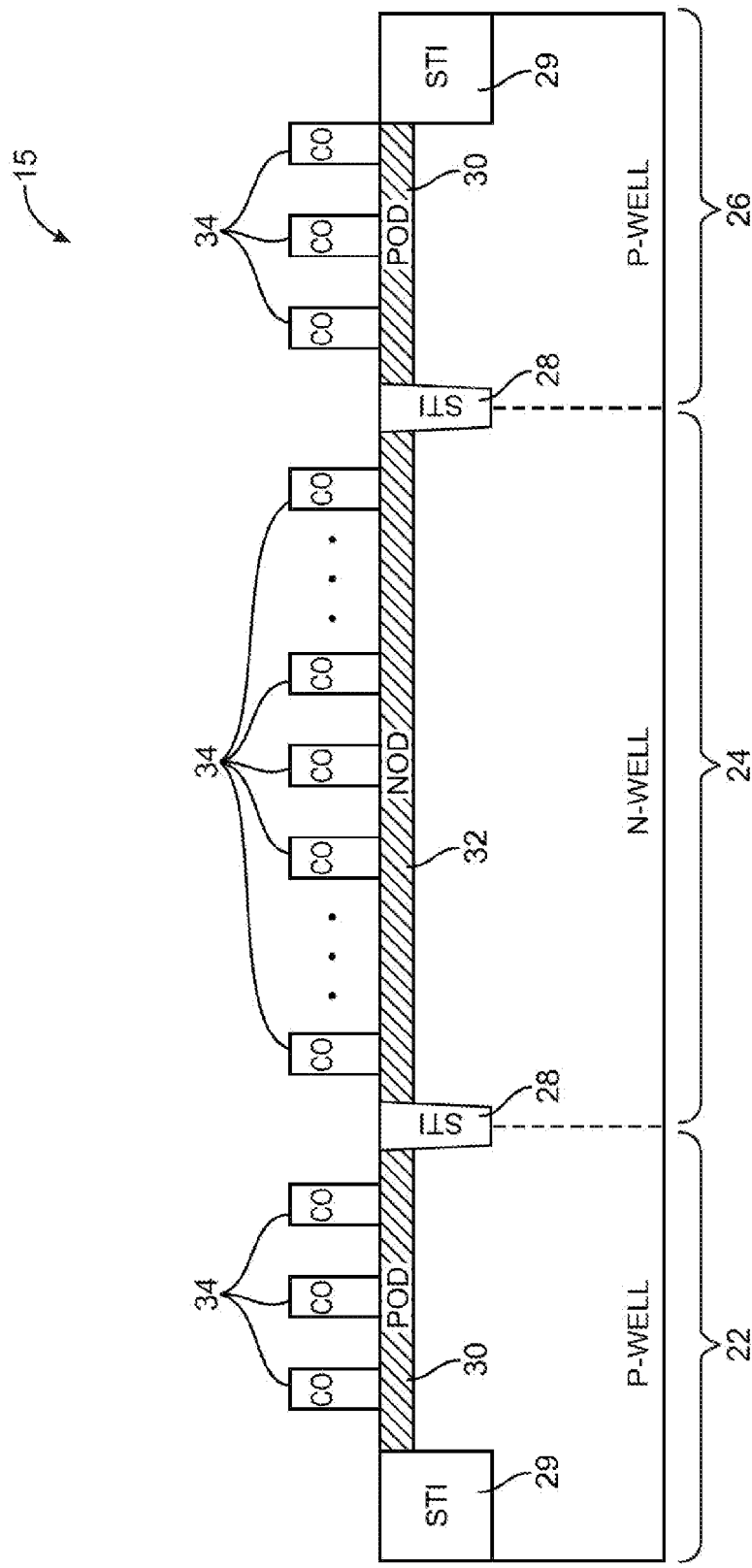
FIG. 2 is a cross-sectional side view of a conventional guard ring.

FIG. 2 shows a cross-sectional side view of a conventional guard ring. Guard ring 15 includes regions 22, 24, and 26. Regions 22, 24, and 26 are separated by shallow trench isolation (STI) structures 28. Guard ring 15 is surrounded by "field" STI structures 29 on both its inner and outer edges.

Regions 22, 24, and 26 include a first p-well, an n-well, and a second p-well formed in the substrate, respectively. P-type diffusion (sometimes referred to as oxide definition regions, oxide diffusion regions, or POD regions) regions 30 (i.e., shallow p+ regions) are formed at the surface of regions 22 and 26. N-type diffusion (sometimes referred to as oxide definition region, diffusion region, or NOD region) region 32 (i.e., a shallow n+ region) is formed at the surface of region 24. Metal contacts (CO) 34 are electrically connected to regions 30 and 32. Conventional guard ring 15 does not include dummy polysilicon or any other density compliance structures to ensure satisfactory planarity is achieved during chemical-mechanical planarization (CMP) polishing operations.

Figure 3:
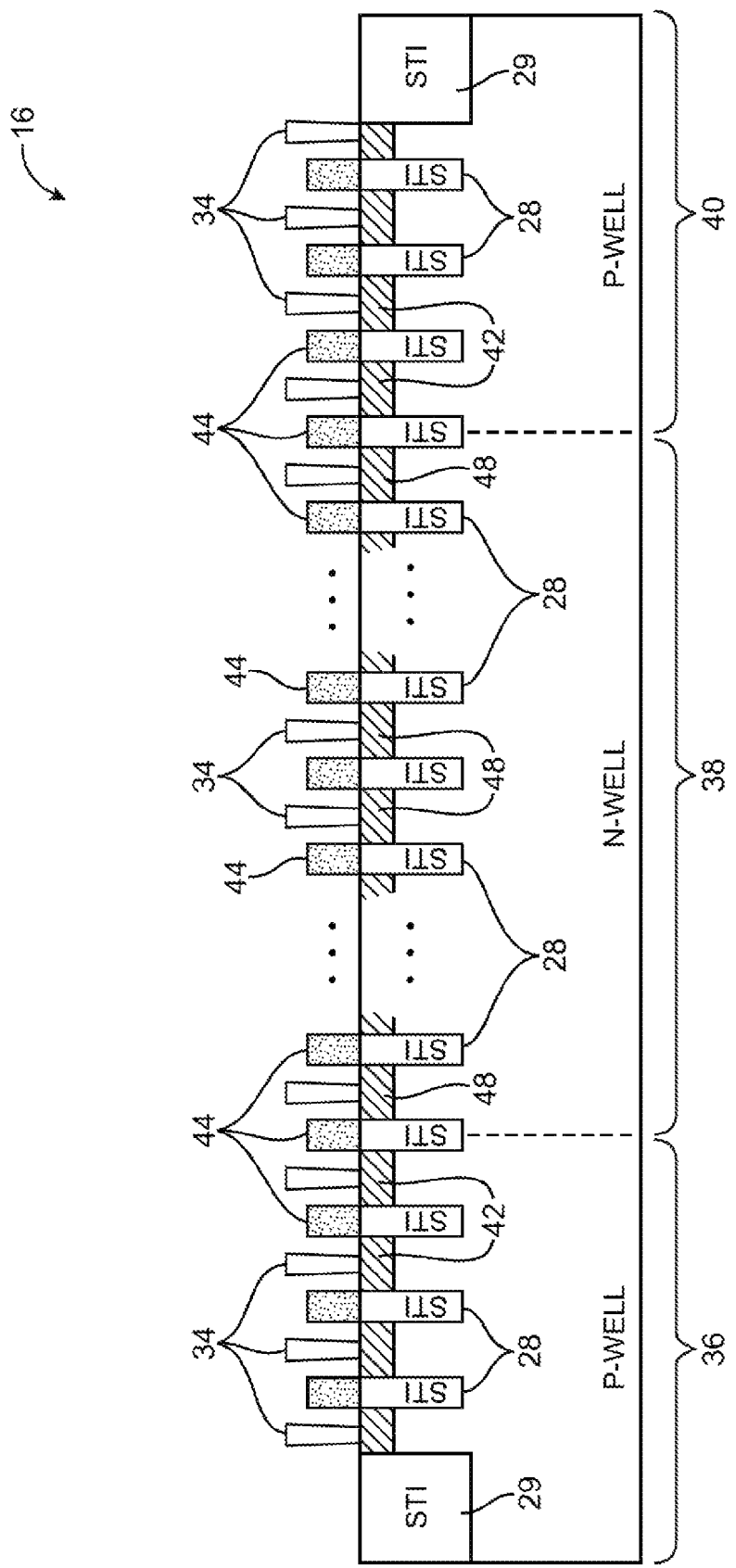
FIG. 3 is a cross-sectional side view of an illustrative guard ring in accordance with an embodiment of the present invention.

A cross-sectional side view of a guard ring with density compliance structures is shown in FIG. 3. Guard ring 16 may have a structure that includes two diodes (e.g., ring-shaped p-n junctions). Each diode may have a first (p-type) terminal and a second (n-type) terminal. The second terminals of the two diodes may be shared between the two diodes. The two diodes may be placed in a reverse-biased state. A guard ring formed using two diodes arranged in this way may prevent passage of noise signals, because both diodes are in the reverse-biased state (e.g., a state that passes negligible current) and because the two diodes are formed in an opposing orientation (e.g., the n-type terminals are shared).

Guard ring 16 may include regions 36, 38, and 40 formed in the substrate of integrated circuit 10. Regions 36, 38, and 40 may be separated by STI structures 28. Guard ring 16 may be surrounded by field STI structures 29 from both sides (i.e., along both the inner and out edges of the guard ring).

Regions 36, 38, and 40 include a first p-well, an n-well, and a second p-well formed in the substrate, respectively. If desired, the doping types of regions 36, 38, and 40 may be reversed. For example, regions 36 and 40 may be p-type and region 38 may have the opposite doping type (i.e., n-type). Regions 36 and 38 may form a first p-n junction (e.g., a p-n diode) while regions 40 and 38 may form a second p-n junction. The n-type terminal (e.g., region 38) of the first and second diodes may be shared.

Density compliance structures may be formed to help ensure proper planarization during CMP operations. the density compliance structures may include a pattern of STI regions 28 and associated dummy polysilicon gate structures 44. In each region (e.g., regions 36, 38, and 40), multiple additional STI structures 28 may be formed between the ring-shaped STI structures that border each region. More than three additional STI structures 28 may be formed in regions 36 and 40, if desired.

P-type diffusion regions such as POD regions 42 (i.e., shallow p+ layers) may be formed at the surface of regions 36 and 40 wherever the multiple additional STI structures 28 are not present. N-type (NOD) regions (i.e., shallow n+ layers) such as NOD regions 48 may be formed at the surface of region 38 where the multiple additional STI structures 28 are not present.

POD regions 42 may sometimes be referred to as "p+" diffusion regions and may be formed from p-type dopants (e.g., boron, gallium, etc.) with concentrations of up to $10^{20}$ dopant atoms/cm$^3$ (as an example). NOD regions 48 may sometimes be referred to as "n+" diffusion regions and may be formed from n-type dopants (e.g., phosphorous, arsenic, etc.) with concentrations of up to $10^{20}$ dopant atoms/cm$^3$.

In general, any region on integrated circuit 10 that is not a diffusion region (e.g., an n-type or p-type oxide definition region) may be occupied by an STI structure. A dummy structure such as dummy structure 44 may be formed on each STI structure 28 in guard ring 16 to form a desired pattern of density compliance structures. Dummy structures 44 preferably do not overlap with diffusion regions 42 and 48.

Dummy structures 44 may be formed from any suitable materials with a density comparable to the density of the transistor gates (e.g., polysilicon gates) and other such structures in surrounding circuitry. With one suitable arrangement, dummy structures 44 may be formed using polysilicon to satisfy polysilicon density requirements (i.e., to ensure the density of the guard ring may substantially match the density of the surrounding circuitry). Density compliance structures such as dummy structures 44 that are used to satisfy density matching requirements may sometimes be referred to as dummy fill structures.

Dummy structures 44 help ensure planarity during CMP processing. This allows guard ring 16 to be formed relatively close to the transistors of the internal circuitry on integrated circuit 10. These transistors (which are sometimes referred to as "functional transistors") may have gate conductors with a gate height (e.g., a gate height that is measured from the surface of the substrate). Dummy structures 44 may have a height that is substantially equal to the gate height of the functional transistors. A transition zone (e.g., an inactive region of density compliance structures that is located between the guard ring and the functional transistors) may be used, but need not be used on integrated circuit due to the presence of the polysilicon density compliance structures in guard ring 16. Dummy gates 44 resist dishing in guard ring 16 during the CMP process so that dummy gate structures 44 and the gate conductors of the functional transistors are polished to a substantially uniform gate height.

Contacts such as contacts 34 may be electrically connected to regions 42 and 48 to allow guard ring 16 to be properly biased. Contacts 34 may be formed using copper, tungsten, other metals, or other suitable conductive materials. Contacts 34 that are connected to POD regions 42 may be driven to a ground voltage (e.g., zero volts). Contacts 34 that are connected to NOD regions 48 may be driven to a positive power supply voltage (e.g., a voltage of 0.8 volts or more). In a guard ring that is biased in this way may, the first diode (e.g., the diode formed from regions 36 and 38) and the second diode (e.g., the diode formed from regions 40 and 38) will both be in a reverse-biased state and will therefore provide signal isolation.

Although contacts 34 cannot be formed over areas occupied by additional multiple STI structures 28 in guard ring 16, increases in contact resistance for guard ring 16 are typically modest and acceptable, because guard ring resistance is dominated by well resistance.

The density compliance structures of guard ring 16 may be arranged in a striped pattern, a checkerboard pattern, a striped pattern with jogs, etc. Guard ring 16 may, for example, have stripes of diffusion regions that are separated by stripes of additional STI structures in each of respective regions 36, 38, and 40.

Figure 4:
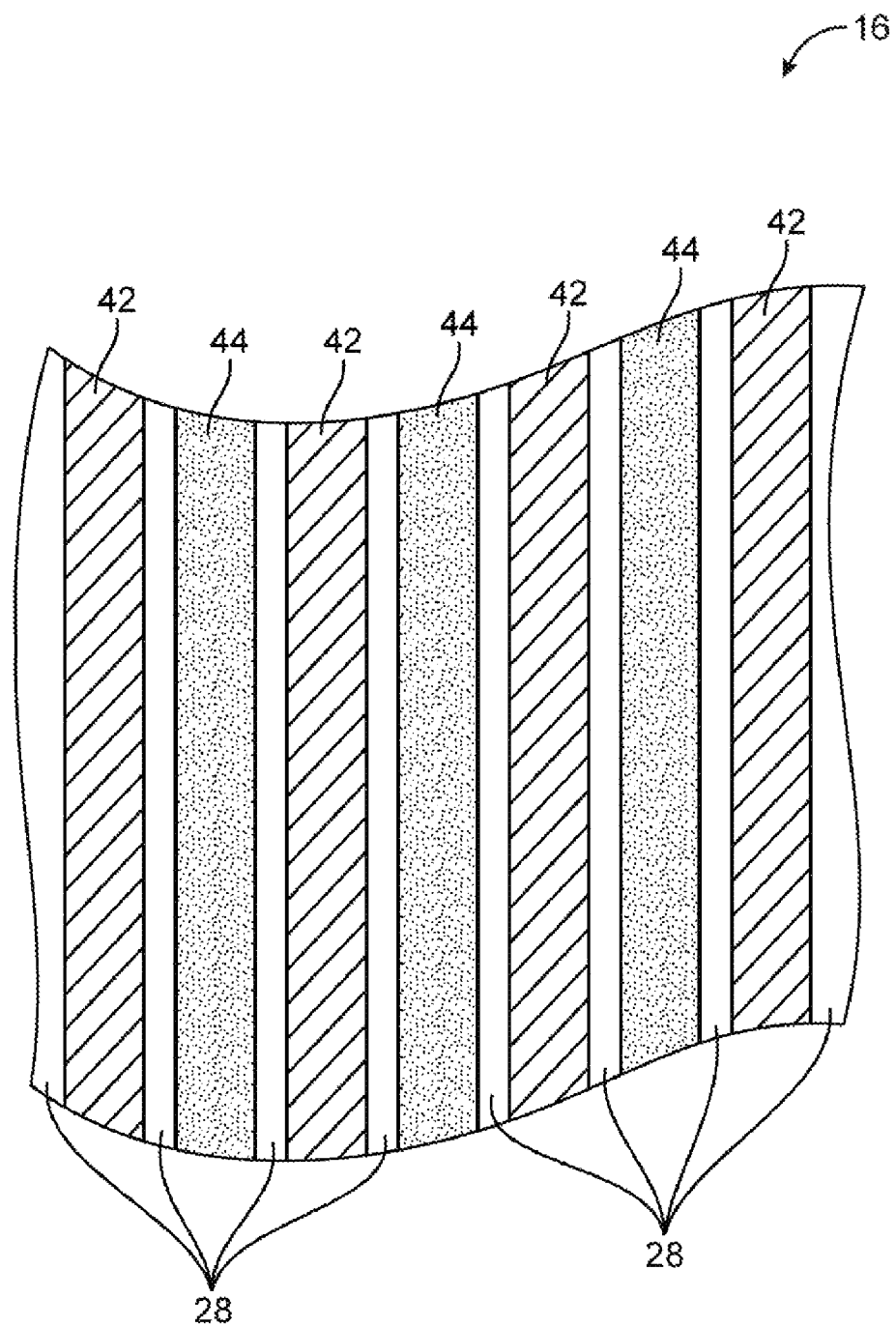
FIG. 4 is a top view of an illustrative guard ring with a striped pattern of density compliance structures in accordance with an embodiment of the present invention.

FIG. 4 is a top view of an illustrative striped arrangement that may be used in guard ring 16. As shown in FIG. 4, regions of guard ring 16 such as region 36 may include diffusion regions 42 that are formed in a striped arrangement (e.g., an arrangement in which the diffusion regions are formed in substantially parallel stripes in the substrate). Areas in the substrate that are not occupied by the diffusion regions may be occupied by corresponding striped STI structures 28. Stripes of dummy structures 44 may be formed over striped STI structures 28 so that dummy structures 44 do not overlap the diffusion regions. Regions 38 and 40 of guard ring 16 may also be formed using this type of striped arrangement.

Figure 5:
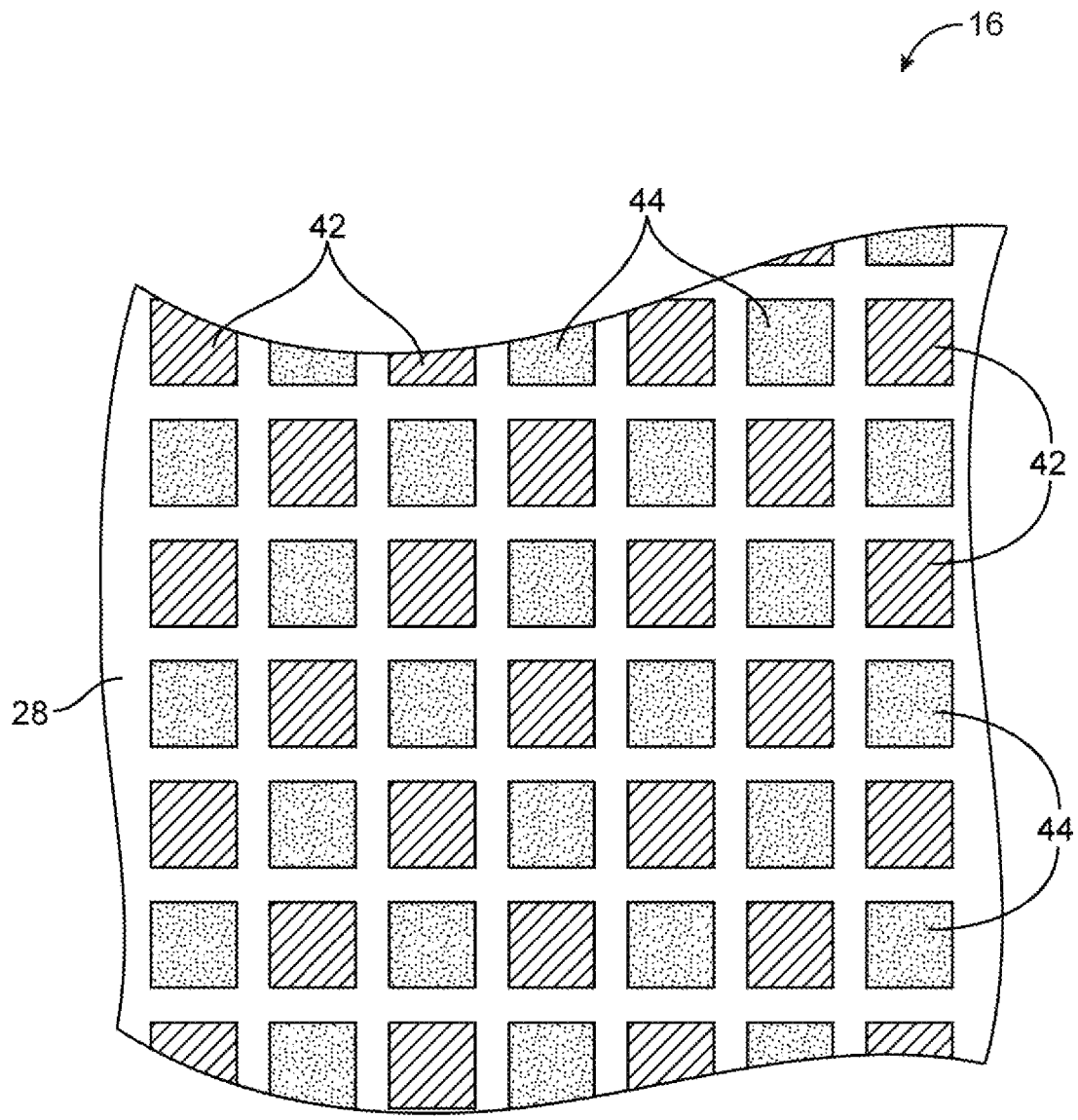
FIG. 5 is a top view of an illustrative guard ring with a checkered pattern of density compliance structures in accordance with an embodiment of the present invention.

FIG. 5 shows another suitable arrangement for guard ring 16. As shown in the example of FIG. 5, region 36 may include diffusion regions 42 that are formed in a checkered arrangement (e.g., an arrangement in which blocks of diffusion regions are formed using a regular checkered pattern in the substrate). Areas in the substrate that are not occupied by the diffusion regions may be occupied by corresponding checkerboard STI structures 28. Blocks of dummy structures 44 may be formed over portions of STI structures 28 so that dummy structures 44 do not overlap with the diffusion regions. The blocks of dummy structures 44 may be formed in a checkered arrangement matching the pattern of STI structures 28. Regions 38 and 40 of guard ring 16 may also be formed using this type of checkered arrangement.

Figure 6:
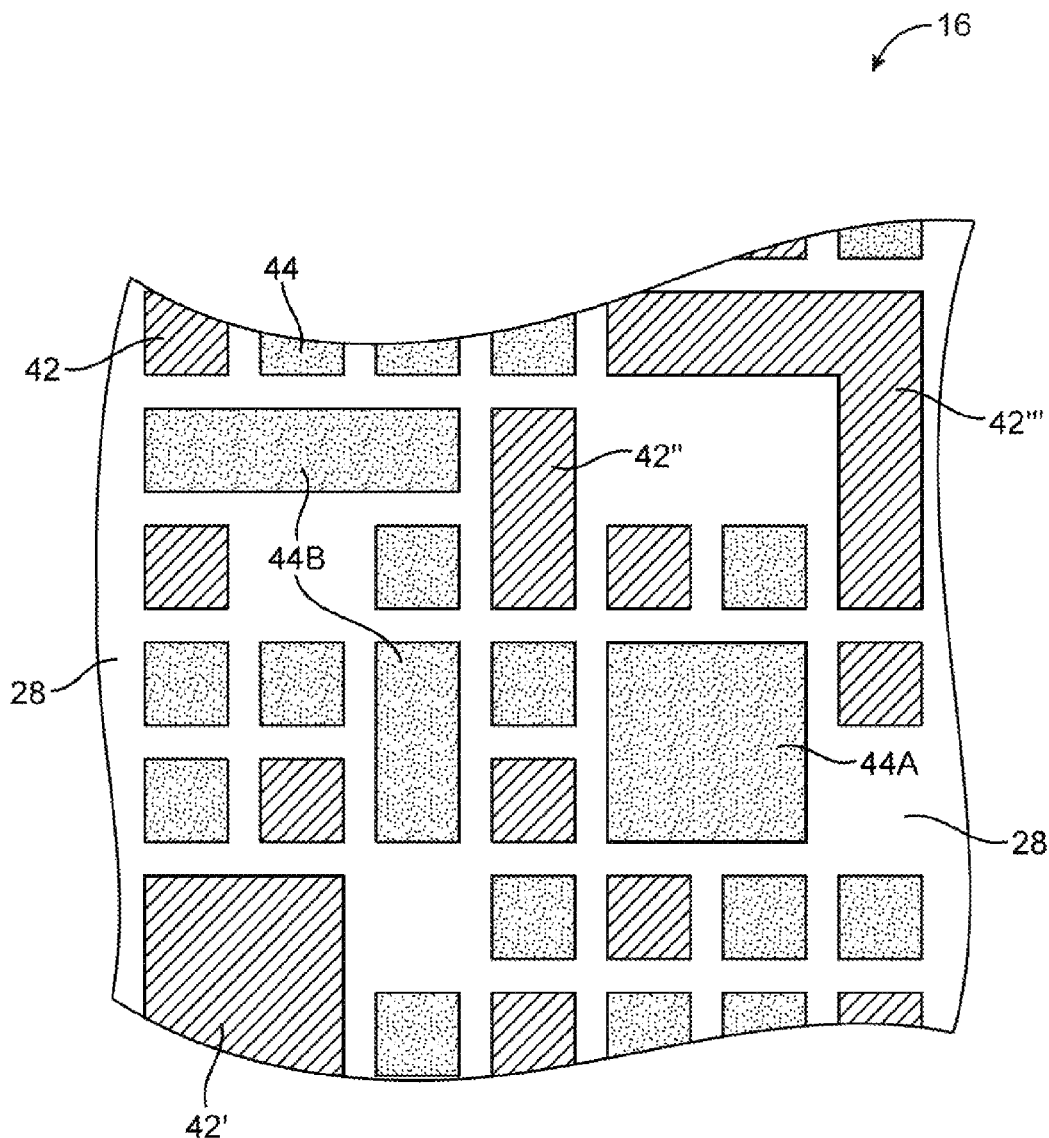
FIG. 6 is a top view of an illustrative guard ring with a non-uniform arrangement of density compliance structures in accordance with an embodiment of the present invention.

FIG. 6 shows another suitable arrangement for guard ring 16. As shown in FIG. 6, region 36 of guard ring 16 may include diffusion regions 42 that are formed in a non-uniform (irregular) arrangement. Blocks of diffusion regions having various shapes and sizes such as regions 42, 42', 42", and 42''' in FIG. 6 may be formed in any desired pattern and location in the substrate. Areas in the substrate that are not occupied by the diffusion regions may be occupied by STI structures 28. Blocks of dummy structures having various shapes and sizes such as dummy structures 44, 44A, and 44B may be formed in any desired pattern that does not overlap with the diffusion regions (see, e.g., FIG. 6). Regions 38 and 40 of guard ring 16 may also be formed using a non-uniform arrangement.

The arrangements shown in FIGS. 4, 5, and 6 are merely illustrative. Contacts 34 of FIG. 3 are not shown in FIGS. 4, 5, and 6 to avoid over-complicating the drawings. Regions 36, 38, and 40 may be formed using any combination of the arrangements described in connections with FIGS. 4, 5, and 6 or other suitable configurations, if desired.

Figure 7:
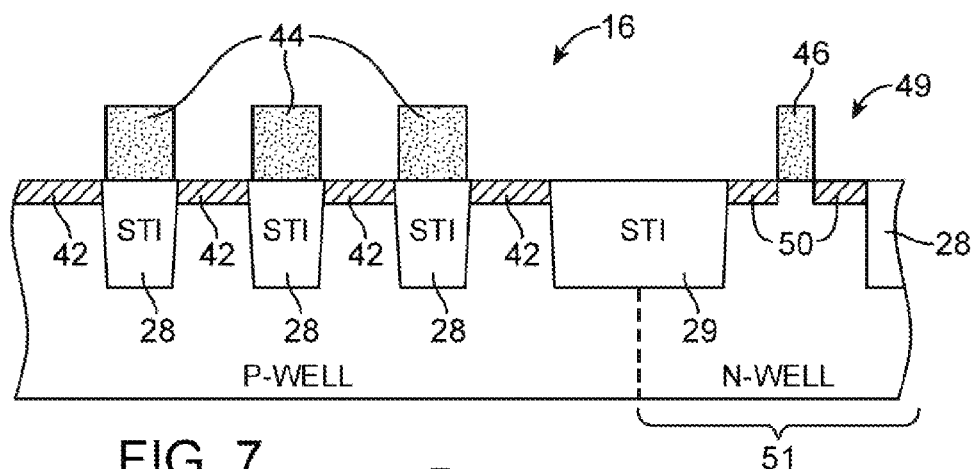
FIGS. 7, 8, and 9 are cross-sectional side views of an integrated circuit illustrating steps involved in forming a guard ring in accordance with an embodiment of the present invention.
Figure 8:
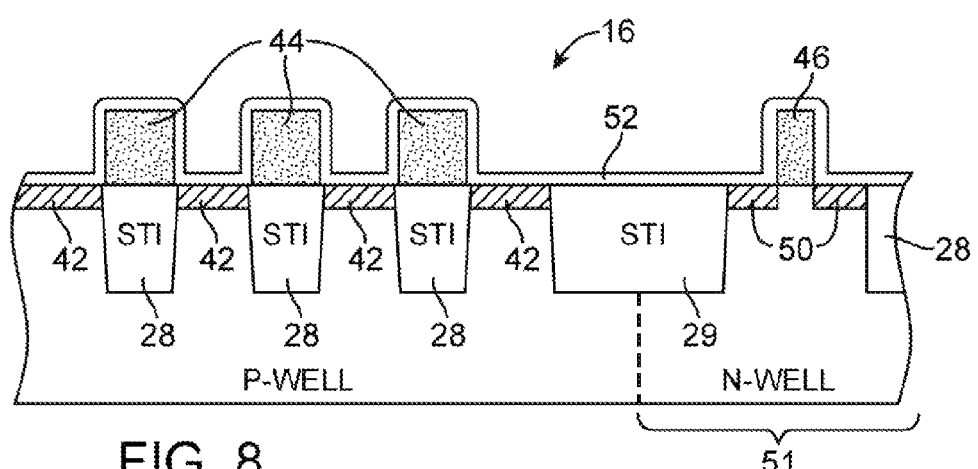
Figure 9:
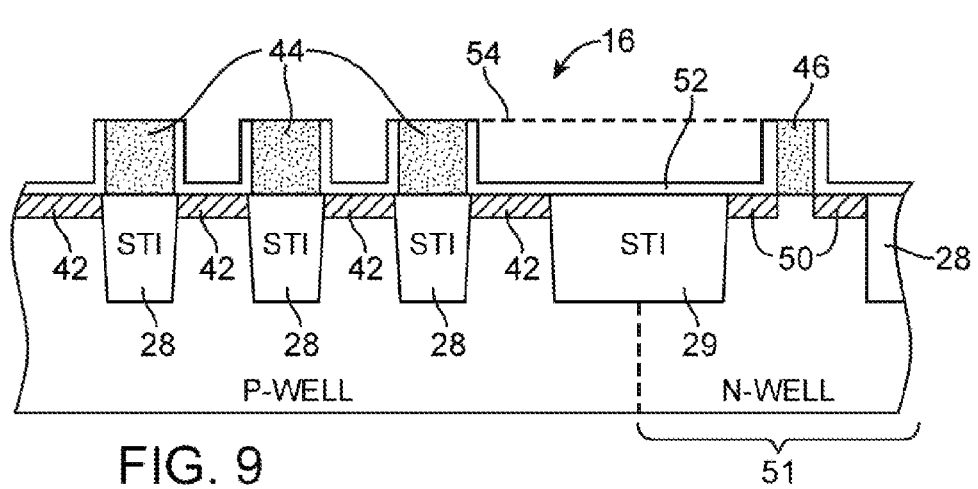

FIGS. 7-9 show steps involved in forming guard ring 16 on integrated circuit 10. Guard ring 16 may be formed adjacent to internal circuits that are located in region 51 (see, e.g., FIG. 7). Guard ring 16 and circuitry 51 may be separated by field STI structure 29. Circuitry 51 may include operation transistors such as transistor 49. Transistor 49 may have an operational gate conductor such as gate 46 and active diffusion regions such as diffusion regions 50 formed in the substrate.

For example, transistor 49 may be an n-channel metal-oxide-semiconductor (NMOS) device. NMOS transistor 49 may have n-type active diffusion regions 50 formed in an n-well. The circuitry in region 51 may also include p-channel metal-oxide-semiconductor (PMOS) devices having p-type active diffusion regions formed in p-wells. The circuitry in region 51 may include millions or billions of NMOS and/or PMOS transistors, if desired.

As shown in FIG. 7, dummy structures 44 of guard ring 16 and gate 46 of transistor 49 may be formed on top of the surface of the substrate and may be formed using polysilicon (as an example).

A layer such as nitride layer 52 may be formed over integrated circuit 10, as shown in FIG. 8. Nitride layer 52 may be a blanket layer that is deposited over integrated circuit 10 to provide electrical isolation for the gate conductors of the functional transistors in region 51. If desired, materials other than nitride may be used to form layer 52.

A CMP process may then be used to remove a top layer of nitride and thereby expose the top surfaces of dummy gates 44 and gates 46, as shown in FIG. 9. The CMP processing step may polish and planarize integrated circuit 10 as indicated by horizontal dotted line 54. The surface of the substrate and line 54 may be separated by a distance that is substantially equal to the height of gate 46 and dummy structures 44 (i.e., the density compliance structures formed from STI regions 28 and dummy structures 44 help ensure planarity).

Figure 10:
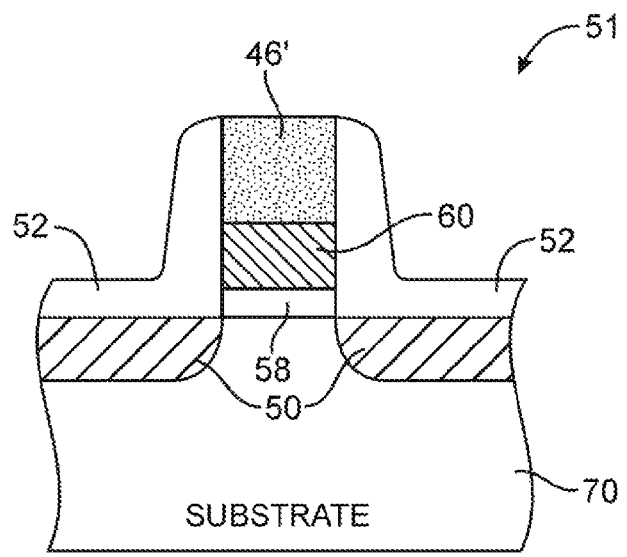
FIG. 10 is a cross-sectional side view of an operational transistor with a replacement operational gate in accordance with an embodiment of the present invention.
Figure 11:
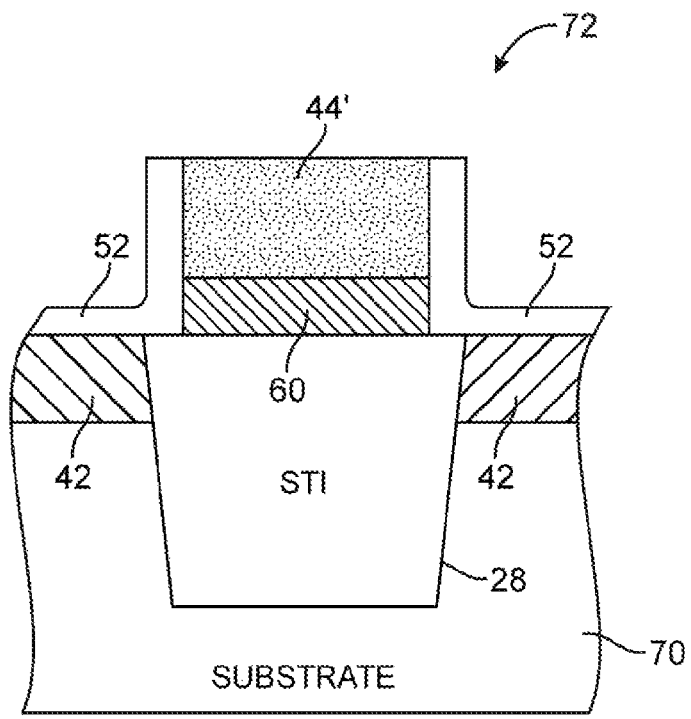
FIG. 11 is a cross-sectional side view of a portion of a guard ring with a replacement dummy gate structure in accordance with an embodiment of the present invention.

FIG. 10 shows an example where replacement gates of operational transistors are formed using polysilicon 46' (i.e., polysilicon 46' formed over hafnium 60 and gate oxide 58 on top of substrate 70). In guard ring 16, replacement dummy gates (which are reformed versions of dummy gate structures 44 in FIG. 9) are formed using polysilicon 44' (i.e., polysilicon 44' replaces polysilicon 44 of FIG. 9 and lies over hafnium layer 60 that is on top of substrate 70).

Figure 12:
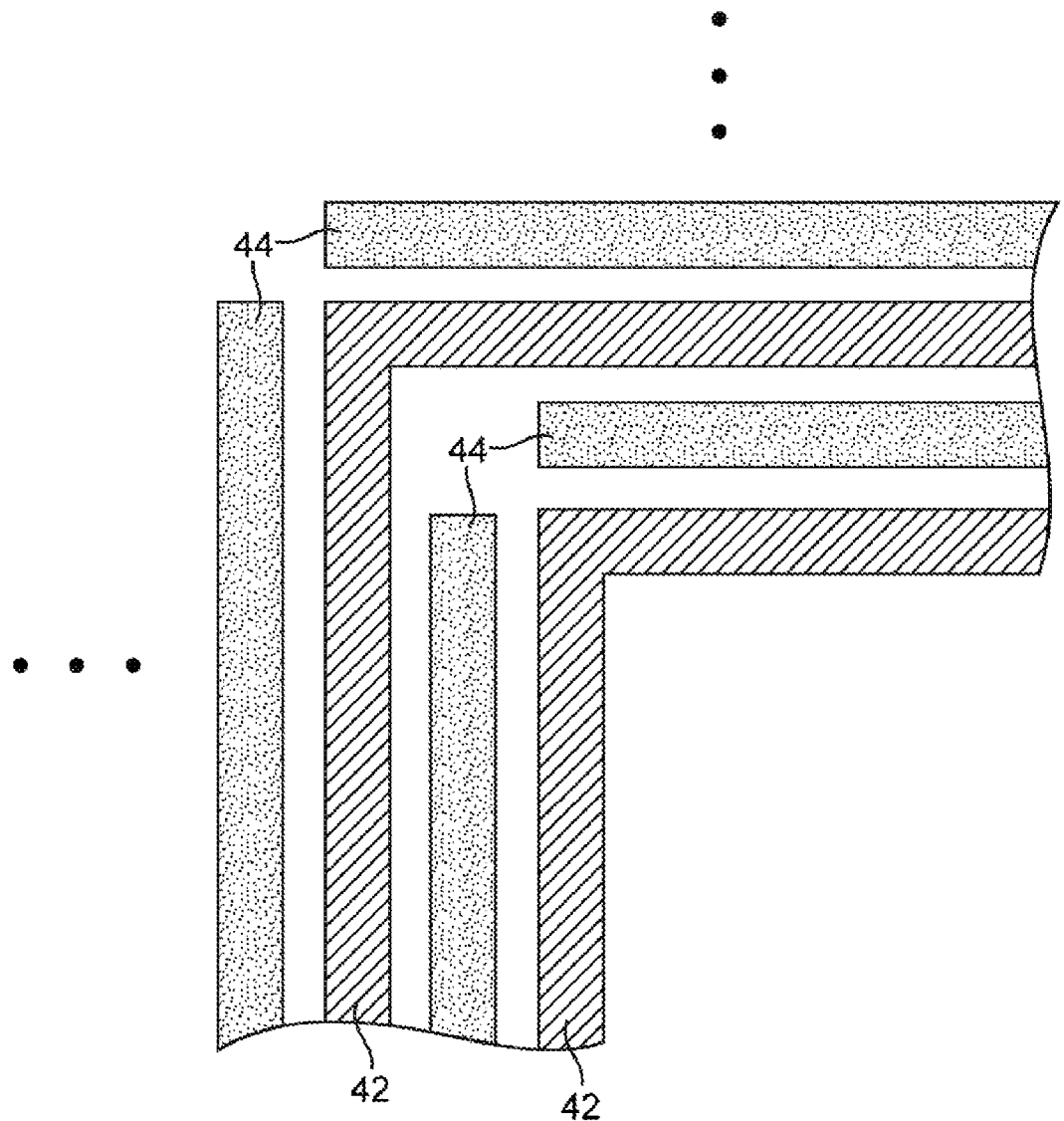
FIG. 12 is a top view of a corner region of an illustrative guard ring in accordance with an embodiment of the present invention.

Guard ring 16 may have bends (see, e.g., FIG. 1). FIG. 12 is a top view of guard ring 16 showing an illustrative corner region of guard ring 16. Contacts 34 of FIG. 3 are not shown in FIG. 12 to avoid over-complicating the drawing. As shown in FIG. 12, the stripes of diffusion regions 42 may be continuous (e.g., continuity may be provided by a 90 degree bend) while the stripes of dummy structures 44 are discontinuous at the corners. Diffusion regions 42 need not be continuous, if desired.

Figure 13:
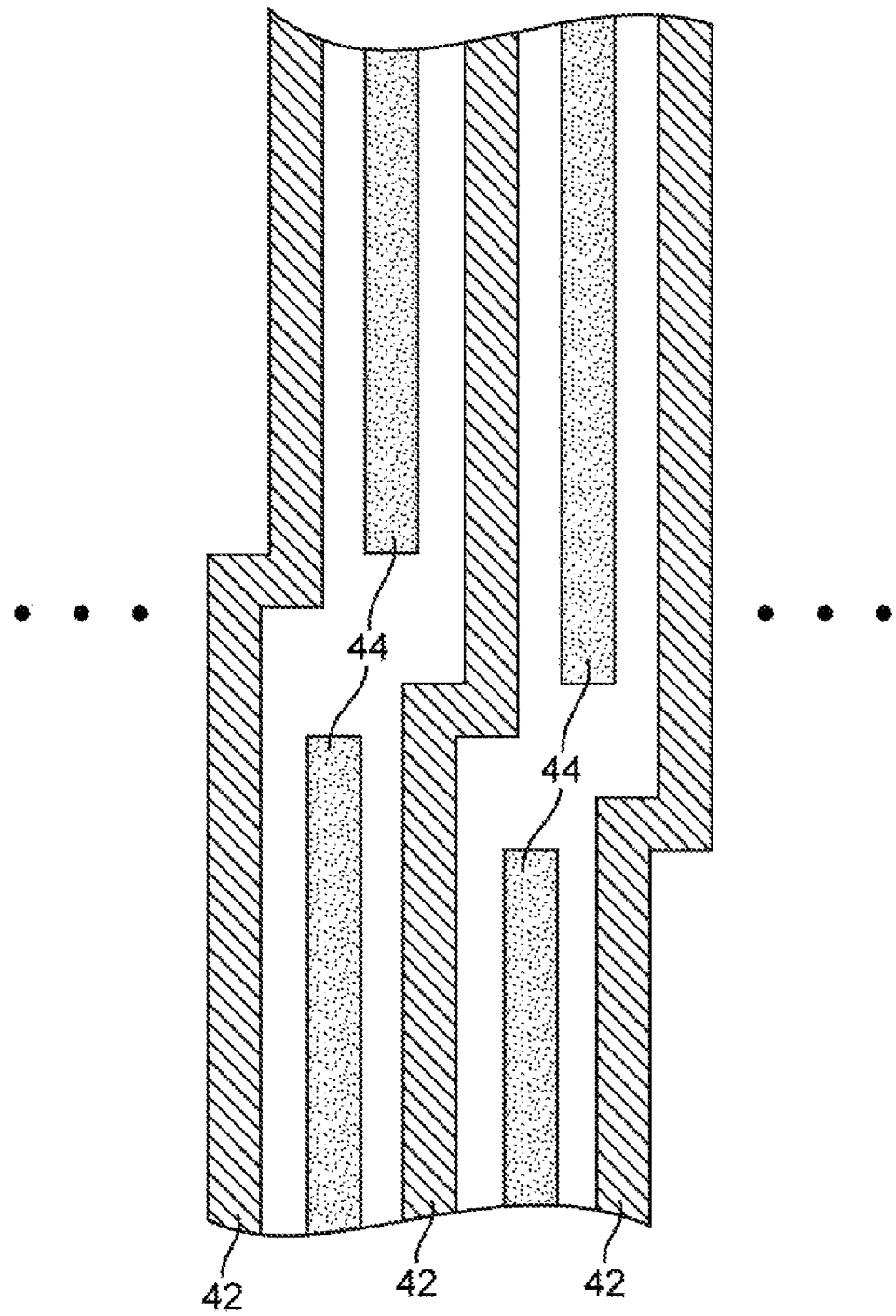
FIG. 13 is a top view of a region of an illustrative guard ring that contains a series of bent stripes of density compliance structures in accordance with an embodiment of the present invention.

Guard ring 16 may have jogs. As shown in FIG. 13, the stripes of diffusion regions 42 may be continuous (e.g., continuity may be provided by two consecutive orthogonal bends) while the stripes of dummy structures 44 are discontinuous. If desired, diffusion regions 42 of the type shown in FIG. 13 need not be continuous.

The samples shown in FIGS. 12 and 13 are merely illustrative. Guard ring 16 may be formed in any suitable configuration to surround and to guard any functional circuitry from undesirable leakage, noise currents, electrical coupling, etc., and may be provided with any suitable pattern of density compliance structures (e.g., polysilicon dummy gates and STI regions formed in stripes, bent stripes, discontinuous stripes, irregular patterns, checkerboard patterns, etc.

The foregoing is merely illustrative of the principles of this invention and various modifications can be made by those skilled in the art without departing from the scope and spirit of the invention.

What is claimed is:
1. An integrated circuit, comprising:
   circuitry;
   a guard ring surrounding the circuitry, wherein the guard ring includes a plurality of dummy gate structures; and
   shallow trench isolation structures under the plurality of dummy gate structures in the guard ring.

2. The integrated circuit defined in claim 1, wherein the shallow trench isolation structures and the plurality of dummy gate structures are formed in a striped pattern.

3. The integrated circuit defined in claim 1, wherein the shallow trench isolation structures and the plurality of dummy gate structures are formed in a checkerboard pattern.

4. The integrated circuit defined in claim 1, further comprising:
diffusion regions formed in areas of the guard ring that are devoid of the shallow trench isolation structures; and
metal contacts formed on the diffusion regions, wherein the guard ring includes a first ring-shaped well of a first doping type, a second ring-shaped well of a second doping type that is opposite to the first doping type, and a third ring-shaped well of the first doping type and wherein the second ring-shaped well is interposed between the first ring-shaped well and the third ring-shaped well.

5. The integrated circuit defined in claim 4, wherein the first and third ring-shaped wells comprise ring-shaped p-wells.

6. The integrated circuit defined in claim 5, wherein the second ring-shaped well comprises a ring-shaped n-well.

7. An integrated circuit, comprising:
circuitry;
a guard ring surrounding the circuitry, wherein the guard ring includes a plurality of dummy gate structures, wherein the plurality of dummy gate structures comprise polysilicon.

8. An integrated circuit formed from a substrate, comprising:
a guard ring that includes a first ring-shaped well of a first doping type, a second ring-shaped well of a second doping type that is opposite to the first doping type, and a third ring-shaped well of the first doping type, wherein the second ring-shaped well is interposed between the first ring-shaped well and the third ring-shaped well;
a first ring-shaped shallow trench isolation structure interposed between the first ring-shaped well and the second ring-shaped well;
a second ring-shaped shallow trench isolation structure interposed between the second ring-shaped well and the third ring-shaped well; and
a plurality of shallow trench isolation structures formed in the second ring-shaped well between the first ring-shaped shallow trench isolation structure and the second ring-shaped shallow trench isolation structure.

9. The integrated circuit defined in claim 8, further comprising a plurality of polysilicon dummy gate structures disposed over the plurality of shallow trench isolation structures.

10. The integrated circuit defined in claim 9, further comprising:
an additional plurality of shallow trench isolation structures and an additional plurality of polysilicon dummy gate structures formed within the first ring-shaped well and the third ring-shaped well.

11. The integrated circuit defined in claim 9, further comprising:
an additional plurality of shallow trench isolation structures formed within the first ring-shaped well and the third ring-shaped well.

12. The integrated circuit defined in claim 8, wherein the first ring-shaped well and the third ring-shaped well comprise ring-shaped p-wells and wherein the second ring-shaped well comprises a ring-shaped n-well.

13. The integrated circuit defined in claim 8 further comprising:
a first polysilicon structure on the first ring-shaped shallow trench isolation structure; and
a second polysilicon structure on the second ring-shaped shallow trench isolation structure.

14. An integrated circuit, comprising:
circuitry;
a guard ring surrounding the circuitry, wherein the guard ring includes a plurality of dummy gate structures, and wherein the plurality of dummy gate structures are formed in a striped pattern.

15. An integrated circuit formed in a substrate, comprising:
a guard ring that includes a first ring-shaped well of a first doping type, a second ring-shaped well of a second doping type that is opposite to the first doping type, and a third ring-shaped well of the first doping type, wherein the second ring-shaped well is interposed between the first ring-shaped well and the third ring-shaped well;
a first ring-shaped shallow trench isolation structure interposed between the first ring-shaped well and the second ring-shaped well;
a second ring-shaped shallow trench isolation structure interposed between the second ring-shaped well and the third ring-shaped well;
a first polysilicon structure on the first ring-shaped shallow trench isolation structure; and
a second polysilicon structure on the second ring-shaped shallow trench isolation structure.

16. The integrated circuit defined in claim 15, further comprising a plurality of additional shallow trench isolation structures formed in a doped well.

17. The integrated circuit defined in claim 16, wherein the doped well comprises the first ring-shaped well.

18. The integrated circuit defined in claim 16, wherein the doped well comprises the second ring-shaped well.

19. The integrated circuit defined in claim 15, further comprising:
a first plurality of shallow trench isolation structures formed in the first ring-shaped well;
a second plurality of shallow trench isolation structures formed in the second ring-shaped well; and
a third plurality of shallow trench isolation structures formed in the third ring-shaped well.

20. The integrated circuit defined in claim 19, further comprising:
diffusion regions formed in areas of the guard ring that are devoid of the shallow trench isolation structures; and
conductive contacts formed on the diffusion regions.

21. The integrated circuit defined in claim 19, further comprising:
additional polysilicon structures formed on the first, second, and third plurality of shallow trench isolation structures in the first, second, and third ring-shaped wells.

22. An integrated circuit, comprising:
circuitry; and
a guard ring surrounding the circuitry, wherein the guard ring includes a plurality of dummy gate structures that are electrically isolated from voltage biasing paths in the integrated circuit.

* * * * *